(12) United States Patent
Xu et al.

(10) Patent No.: US 9,172,338 B2
(45) Date of Patent: Oct. 27, 2015

(54) TRANSFORMER-BASED RF POWER AMPLIFIER

(75) Inventors: Hongtao Xu, Portland, OR (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,080

(22) PCT Filed: Jun. 1, 2012

(86) PCT No.: PCT/US2012/040534
§ 371 (c)(1),
(2), (4) Date: Jun. 17, 2014

(87) PCT Pub. No.: WO2013/180733
PCT Pub. Date: Dec. 5, 2013

(65) Prior Publication Data
US 2015/0078482 A1    Mar. 19, 2015

(51) Int. Cl.
*H04L 25/49* (2006.01)
*H03F 3/213* (2006.01)
*H03F 3/195* (2006.01)
*H03F 3/21* (2006.01)
*H03F 3/24* (2006.01)
(Continued)

(52) U.S. Cl.
CPC ............... *H03F 3/213* (2013.01); *H03F 3/195* (2013.01); *H03F 3/211* (2013.01); *H03F 3/245* (2013.01); *H03F 3/45179* (2013.01); *H04B 1/04* (2013.01); *H03F 2200/451* (2013.01); *H03F 2200/541* (2013.01); *H03F 2203/21142* (2013.01); *H03F 2203/45394* (2013.01); *H03F 2203/45682* (2013.01); *H03F 2203/45731* (2013.01); *H04B 2001/0408* (2013.01)

(58) Field of Classification Search
CPC .................... H03F 2200/534; H03F 2200/537; H03F 2200/541; H03F 3/211; H03F 3/602; H03F 3/24; H03F 3/68; H03F 1/3247; H04L 25/4902; H04L 27/368; H04B 3/54
USPC .......... 375/257–258, 295, 297, 377; 330/277, 330/286, 53, 127
See application file for complete search history.

(56) References Cited

U.S. PATENT DOCUMENTS 7,129,784 B2 * 10/2006 Bhatti et al. ................... 330/295
8,076,975 B1 * 12/2011 Lender et al. ................. 330/286
(Continued)

FOREIGN PATENT DOCUMENTS

CN     104254973 A    12/2014
WO    WO-2005046050 A1    5/2005
WO    WO-2013180733 A1    12/2013

OTHER PUBLICATIONS

"International Application Serial No. PCT/US2012/040534, International Search Report mailed Jan. 10, 2013", 3 pgs.
(Continued)

*Primary Examiner* — Khanh C Tran
(74) *Attorney, Agent, or Firm* — Blakely, Sokoloff, Taylor & Zafman LLP

(57) ABSTRACT

Various embodiments include a power amplifier having power amplifier cells located in a die, conductive contacts overlying a surface of the die and coupled to the amplifier cells, and conductive lines overlying a surface of the die between the conductive contacts and coupled to the power amplifier cells. Additional apparatus are described.

26 Claims, 7 Drawing Sheets

(51) Int. Cl.
*H03F 3/45* (2006.01)
*H04B 1/04* (2006.01)

(56) References Cited

U.S. PATENT DOCUMENTS

| | | | |
|---|---|---|---|
| 8,179,775 B2* | 5/2012 | Chen et al. | 370/203 |
| 8,188,788 B2* | 5/2012 | Lee | 330/51 |
| 8,766,719 B2* | 7/2014 | Lai et al. | 330/151 |
| 2008/0185686 A1* | 8/2008 | Secareanu et al. | 257/536 |
| 2011/0222443 A1* | 9/2011 | Khlat | 370/277 |
| 2011/0300813 A1* | 12/2011 | Mirzaei et al. | 455/78 |

OTHER PUBLICATIONS

"International Application Serial No. PCT/US2012/040534, Written Opinion mailed Jan. 10, 2013", 6 pgs.

Gang, Liu, et al., "Fully Integrated CMOS Power Amplifier With Efficiency Enhancement at Power Back-Off", IEEE Journal of Solid-State Circuits, vol. 43, No. 3. See abstract, figures 1, 2, 11 and corresponding detailed description., (Mar. 2008), 600-609.

Ichiro, Aoki, et al., "A Fully-Integrated Quad-Band GSM/GPRS CMOS Power Amplifier", In: IEEE Journal of Solid-State Circuits, vol. 43, No. 12. See abstract, figure 8 and corresponding detailed description., (Dec. 2008), 2747-2758.

Ichiro, Aoki, et al., "Fully Integrated CMOS Power Amplifier Design Using the Distributed Active-Transformer Architecture", In: IEEE Journal of Solid-State Circuits, vol. 37, No. 3. See abstract, figures 10, 12 and corresponding detailed description., (Mar. 2002), 371-383.

Peter, Haldi, et al., "A 5.8 GHz 1 V Linear Power Amplifier Using a Novel On-Chip Transformer Power Combiner in Standard 90 nm CMOS", In: IEEE Journal of Solid-State Circuits, vol. 43, No. 3. See abstract, figures 1, 4 and corresponding detailed description., (May 2008), 1054-1063.

"European Application Serial No. 12877964.2, Amendment filed Nov. 13, 2014", 16 pgs.

"International Application Serial No. PCT/US2012/040534, International Preliminary Report on Patentability mailed Dec. 11, 2014", 8 pgs.

* cited by examiner

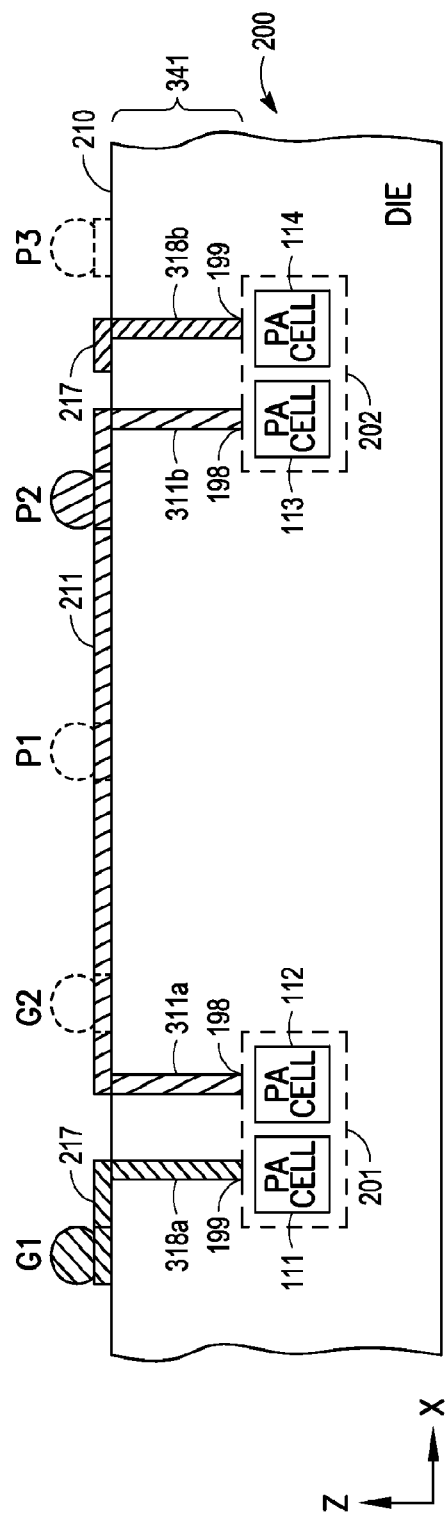
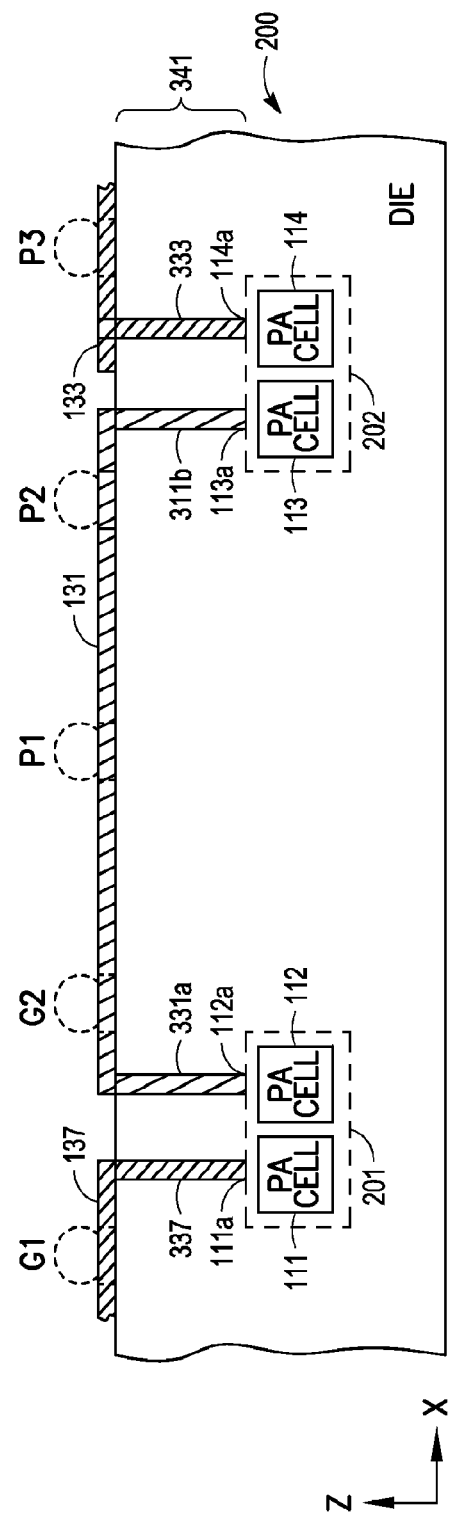
FIG. 3A
FIG. 3B

TRANSFORMER-BASED RF POWER AMPLIFIER

PRIORITY APPLICATION

This application is a U.S. National Stage Application under 35 U.S.C. 371 from International Application No. PCT/US2012/040534, filed Jun. 1, 2012, which is hereby incorporated by reference in its entirety.

FIELD

Embodiments described herein relate to transformers and power amplifiers. Some embodiments relate to radio frequency (RF) power amplifiers in semiconductor devices.

BACKGROUND

Many electronic items, such as cellular phones and computers, usually have power amplifiers and transformers to boost a power level of a signal for various applications. For some applications, the power amplifier, the transformer, or both may need to be in a certain configuration. To accommodate such configuration, the size of the power amplifier, transformer, or both may relatively large. Further, in some cases, heat generated by the power amplifier may become a factor; connections between the power amplifier and the transformer may be hard to arrange; and supply power may be difficult to be routed to the power amplifier. Therefore, in such cases, designing power amplifiers to suit some applications may pose a challenge.

BRIEF DESCRIPTION OF DRAWINGS

FIG. 3A shows a cross section along line 3A the X-direction of the device of FIG. 2A including connections overlying a surface of the die and conductive paths formed in a portion of the die.

FIG. 3B shows another cross section along line 3B the X-direction of the device of FIG. 2A including conductive lines overlying the surface of the die and conductive paths formed in a portion of the die.

DETAILED DESCRIPTION

Figure 1:
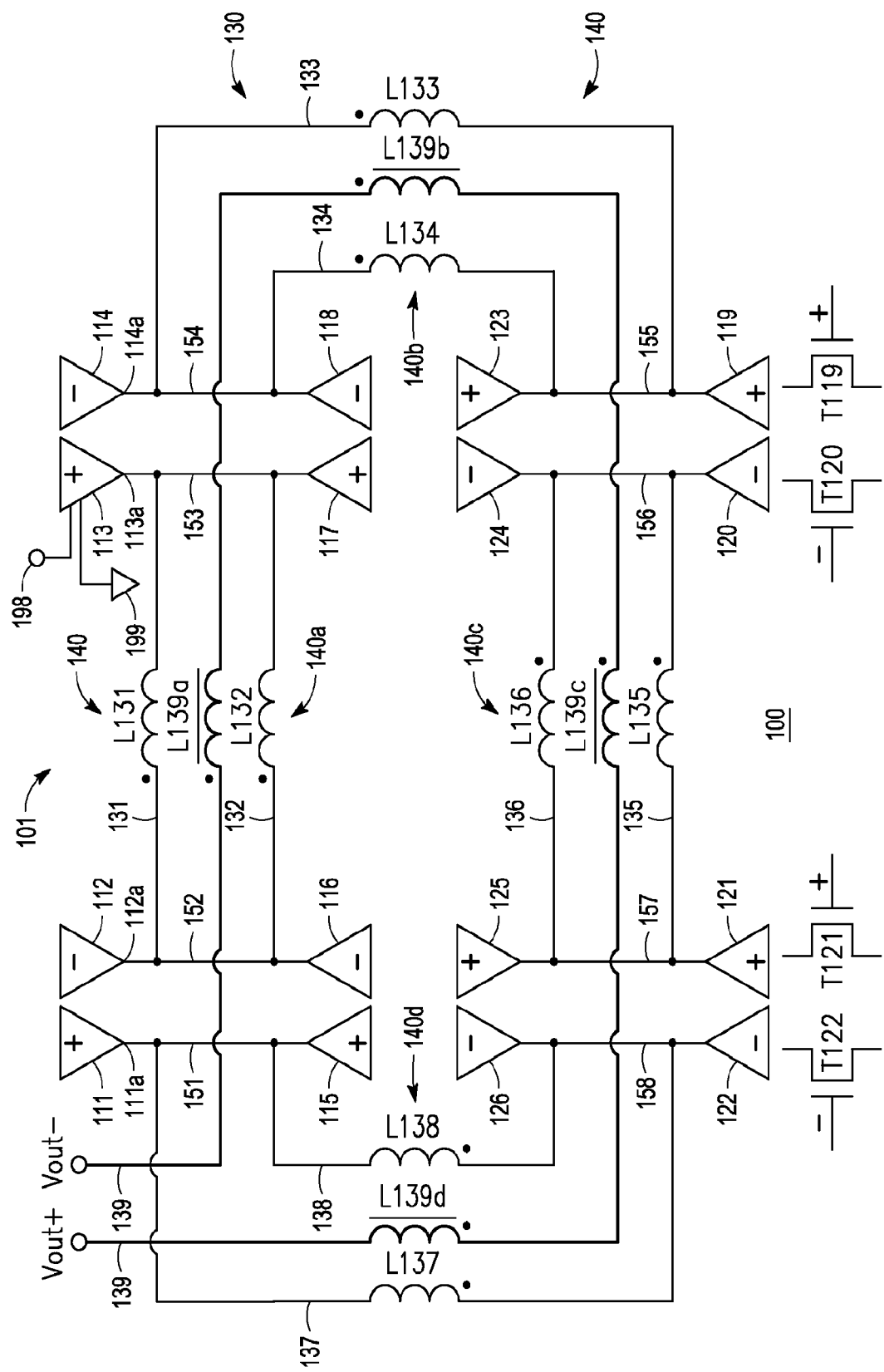
FIG. 1 shows a schematic diagram of a device including a power amplifier having power amplifier cells and a combiner, according to some embodiments described herein.

FIG. 1 shows a schematic diagram of a device 100 including power amplifier 101 having power amplifier cells 111 through 126 and a combiner 130, according to some embodiments described herein. Device 100 may include or be included in wireless communication devices (e.g., cellular phones such as smart phones), computers (e.g., tablet computers), and other electronic devices or systems.

As shown in FIG. 1, each of power amplifier cells 111 through 126 may include an input node to receive an input signal (e.g., signal labeled "+" or "−"). The input signal may include a component of a differential signal (e.g., input differential signal). Each of power amplifier cells 111 through 126 may include an output node. For simplicity, the output nodes (e.g., 111a, 112a, 113a, and 114a) of only four power amplifier cells 111, 112, 113, and 114 are labeled. Each of power amplifier cells 111 through 126 may amplify the signal (signals "+" and "−") at its respective input node and provide amplified signal at its output node.

Two power amplifier cells (that receive two different signals "+" and "−") can form a differential pair. FIG. 1 shows power amplifier 101 including eight differential pairs as an example. The number of differential pairs may vary. The output node of each power amplifier cells 111 through 126 may provide an output signal, which may include a component of a differential signal associated with a respective differential pair. Each of the power amplifier pairs (form by two of power cells 111 through 126) may amplify the signals (signals "+" and "−") at its respective input nodes and provide amplified signals at its output nodes.

Combiner 130 of power amplifier 101 may include a transformer circuit (e.g., a transformer combining circuit) 140 having transformer sections 140a, 140b, 140c, and 140d. Each these four transformer sections may include two transformers. Thus, transformer circuit 140 may include eight transformers. The eight transformers may operate to combine (e.g., transform) signals from the output nodes of power amplifier cells 111 through 126 and provide output signals Vout+ and Vout− at the output nodes (shown in FIG. 1 as two circles next to signals Vout+ and Vout) of power amplifier 101. The Vout+ and Vout− signals may form components of a differential signal (e.g., output differential signal) provided by power amplifier 101. Thus, power amplifier 101 may include a transformer-based power amplifier having a 4-section 8-way transformer combiner configuration.

As shown in FIG. 1, combiner 130 may include conductive lines 131 through 138 and associated inductors L131 through L138, and a conductive line 139 and associated inductors 139a through 139d. Combiner 130 may include connections 151 through 158, each of which may be coupled between the output nodes of two power amplifier cells. In some cases, some or all of connections 151 through 158 may be omitted from combiner 130.

Conductive lines 131 through 138 and inductors L131 through L138 may form part of a primary (e.g., primary windings) of transformer circuit 140. Conductive line 139 and inductors 139a through 139d may form part of a secondary (e.g., a second winding) of transformer circuit 140.

Each of inductors L131 through L138 may be coupled between two output nodes of two respective power amplifier cells through one of conductive lines 131 through 138. For example, inductor L131 may be coupled between the output nodes power amplifier cells 112 and 113 through conductive line 131. In another example, inductor L133 may be coupled between the output nodes power amplifier cells 114 and 119 through conductive line 133.

The inductor (one of L131 through 138) coupled between two power amplifier cells may be located adjacent one of the inductors L139a through L139c to form part of a transformer at one of transformer section 140a, 140b, 140c, and 140d. For example, inductor L131 and inductor L139a may form part of a transformer at transformer section 140a. In another example, inductor L132 and inductor L139a may form part of another transformer at transformer section 140a.

Each of power amplifier cells 111 through 126 may include a single transistor or multiple transistors. For simplicity, FIG. 1 shows only four transistors T119, T120, T121, and T122 included in four respective power amplifier cells 119, 120, 121, and 114. Each of the other power amplifier cells may include a single transistor or multiple transistors similar to transistors T119, T120, T121, and T122. The transistors of power amplifier cells 111 through 126 may include field effect transistors, such as transistors fabricated using complementary metal-oxide-semiconductor (CMOS) processes. Thus, power amplifier cells 111 through 126 may include CMOS transistors. For example, power amplifier cells 111 through 126 may include n-channel MOS (NMOS) transistors and/or p-channel MOS (PMOS) transistors.

Each of power amplifier cells 111, 112, 113, and 114 may receive either input signal (e.g., "+" or signal "−") at the gate its respective transistor. For example, power amplifier cells 119, 120, 121, and 122 may receive their input signals at the gates of transistors (e.g., NMOS transistors) T119, T120, T121, and T122, respectively. The output signal of each of power amplifier cells 111, 112, 113, and 114 can be provided at the drain of their transistors, such as at the drain of transistors T119, T120, T121, and T122.

Each of power amplifier cells 111 through 126 may include supply nodes 198 and 199 to receive power and ground signals, respectively. For simplicity, supply nodes 198 and 199 of only two power amplifier cells 112 and 113 are shown in FIG. 1. Power and ground signals may be provided (e.g., coupled) to the transistors of power amplifier cells 111 to 126 through supply nodes 198 and 199.

In operation, the transistors (e.g., T119, T120, T121, and T122) of power amplifier 101 may operating at a supply voltage (e.g., provided at node 198) of approximately one volt. Power amplifier 101 may have an output power of in a range of approximately 26 dBm to approximately 32 dBm and a peak drain efficiency of approximately 50%. The output power of power amplifier 101 may be provided by the form of signals (e.g., Vout+ and Vout−) at its output nodes (nodes next to signals Vout+ and Vout− in FIG. 1).

Device 100 may include or be included in a system in a chip (SoC), such that power amplifier 101 may be integrated such a system (e.g., form in the same die with other elements, such as a processing unit and a memory).

Power amplifier 101 may be implemented such that it may be a compact, low-loss, high radio RF output power, transformer-based RF power amplifier, as described below with reference to FIG. 2A through FIG. 3C.

Figure 2A:
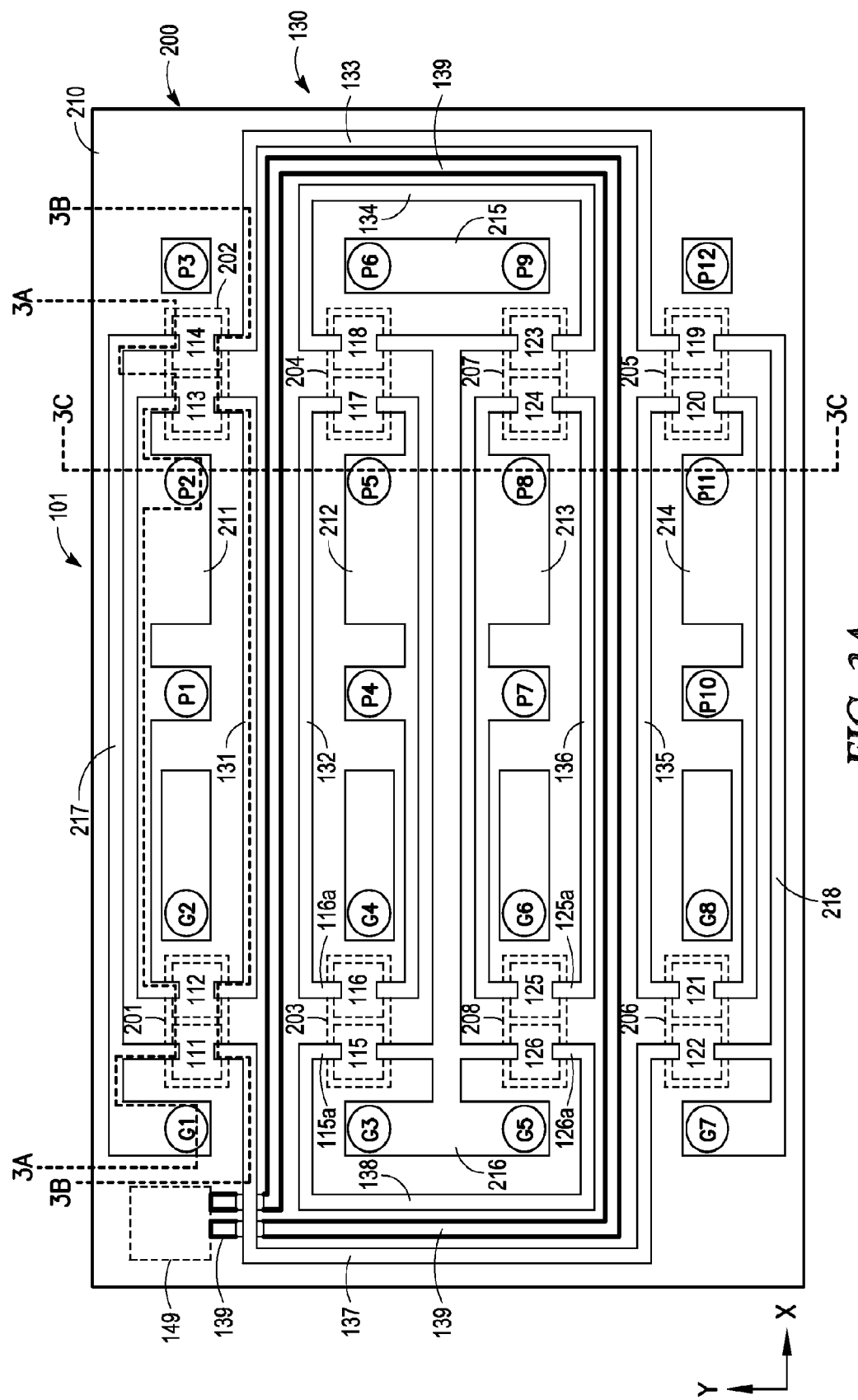
FIG. 2A shows a top view of a structure of the device of FIG. 1 including a die, according to some embodiments described herein.

FIG. 2A shows a top view of a structure of device 100 of FIG. 1 including a die 200, according to some embodiments described herein. Die 200 may include a semiconductor die (e.g., a silicon die) where at least a portion of power amplifier cells 113 through 126 and at least a portion of combiner 130 may be formed.

Die 200 may include a surface 210 and conductive contacts G1 through G8 and P1 through P12 overlying surface 210. These conductive contacts may include solder bumps. Die 200 may be included in a flip-chip package, such that conductive contacts G1 through G8 and P1 through P12 may be coupled to a package substrate (not shown in FIG. 2A) of the flip-chip package without using wires (e.g., without bonding wires). For example, conductive contacts G1 through G8 and P1 through P12 may be coupled to a package substrate of a flip-chip package through controlled collapse chip connections (C4) or other types of connections.

Die 200 may include other conductive contacts similar to or identical to conductive contacts G1 through G8 and P1 through P12. The other conductive contacts may be used to carry signals such as data and clock signals. For simplicity, the other conductive contacts of die are not shown in FIG. 2A.

Some or all of conductive contacts G1 through G8 and P1 through P12 may be coupled to a supply source (e.g., a battery or an alternate current (AC) power source) to receive supply signals (e.g., power and ground signals). For example, some or all of conductive contacts P1 through P12 may receive power signals from the supply source. Some or all or conductive contacts G1 through G8 may receive ground signals from the supply source. In some cases, some of the conductive contacts G1 through G8 and P1 through P12 may be configured to carry signals other than supply signals (e.g., data signals and/or clock signals).

As shown in FIG. 2A, conductive contacts G1 through G8 and P1 through P12 may be arranged in rows and columns with respect to the X-direction and the Y-direction. Conductive contacts G1 through G8 may be electrically separated from conductive contacts P1 through P12. However, some of conductive contacts G1 through G8 may be coupled together, and some of conductive contacts P1 through P8 may be coupled together. For example, FIG. 2A shows some of conductive contacts P1 through P12 may be coupled to each other through respective connections 211 through 215. Conductive contacts G3 and G5 may be coupled to each other through a connection 216. FIG. 2A also shows a connection 217 coupled to conductive contact G1 and a connection 218 coupled to conductive contact G7.

Conductive contacts G1 through G8 may receive the same or similar signals (e.g., ground signals). Conductive contacts P1 through P12 may receive the same or similar signals (e.g., power signals) but may be different from the signals received by conductive contacts G1 through G8. Thus, as shown in FIG. 2A, conductive contacts G1 through G8 may form a group and may be located on one side (e.g., left side) of surface 210 of die 200. Conductive contacts P1 through P12 may form another group and may be located on another side (e.g., right side) of surface 210 of die 200.

As shown in FIG. 2A, conductive lines 131 through 139 may be located in different areas of surface 210 between conductive contacts G1 through G8 and P1 through P12. Inductors L131 through L139 shown in FIG. 1 may be a transmission line type inductor, such that each inductor may be included in (in other words, may be part of) a respective conductive line among conductive lines 131 through 139. Thus, combiner 130 may include no separate (e.g., no additional) inductors besides conductive lines 131 through 139. Therefore, conductive lines 131 through 139 may assume the functions of respective inductors L131 through L139 (FIG. 1).

Each of conductive lines 131 through 139 may include a conductive material overlying surface 210 of die 200. The conductive material may include copper, gold, or other metals or alloys. Connections 211 through 218 (coupled to some of conductive contacts G1 through G8 and some of conductive contacts P1 through P8) may include conductive materials similar to or identical to the materials of conductive lines 131 through 139.

Conductive lines 131 to 138 in FIG. 2A may correspond to the primary of the transformer circuit 140 (FIG. 1). Conductive line 139 in FIG. 2A may correspond to the secondary of transformer circuit 140. Thus, each transformer in each of transformer sections 140a, 140b, 140c, and 140d (FIG. 1) may include a single turn (e.g., single primary and single secondary winding) transmission line transformer. Therefore, transformer circuit 140 may include a single turn transmission line type transformer circuit.

As shown in FIG. 2A, conductive line 139 may forms at least part of a loop. The loop may include an inside that surrounds an area of surface 210 where conductive contacts G3 through G6 and P4 through P9 are located. The loop may include an outside corresponding to an area of surface 210 where conductive contacts G1, G2, G7, G8, P1, P2, P3, P10, P11, and P12 are located. Conductive line 139 may be coupled to other elements 149 of device 100.

Conductive lines 131 through 138 may be located inside or outside the loop formed by conductive line 139. For example, conductive lines 132, 134, 136, and 138 may be located inside the loop. Conductive lines 131, 133, 135, and 137 may be located outside the loop.

Multiple conductive segments of conductive lines 131 through 139 may located between two of conductive contacts G1 through G8 and P1 through P12. For example, three conductive segments of three respective conductive lines 131, 132, and 139 along the X-direction may be located between conductive contacts G2 and G4, P1 and P4, or P2 and P5. In another example, three conductive segments of three respective conductive lines 135, 136, and 139 along the X-direction may be located between conductive contacts G6 and G8, P7 and P10, or P8 and P11.

Figure 2B:
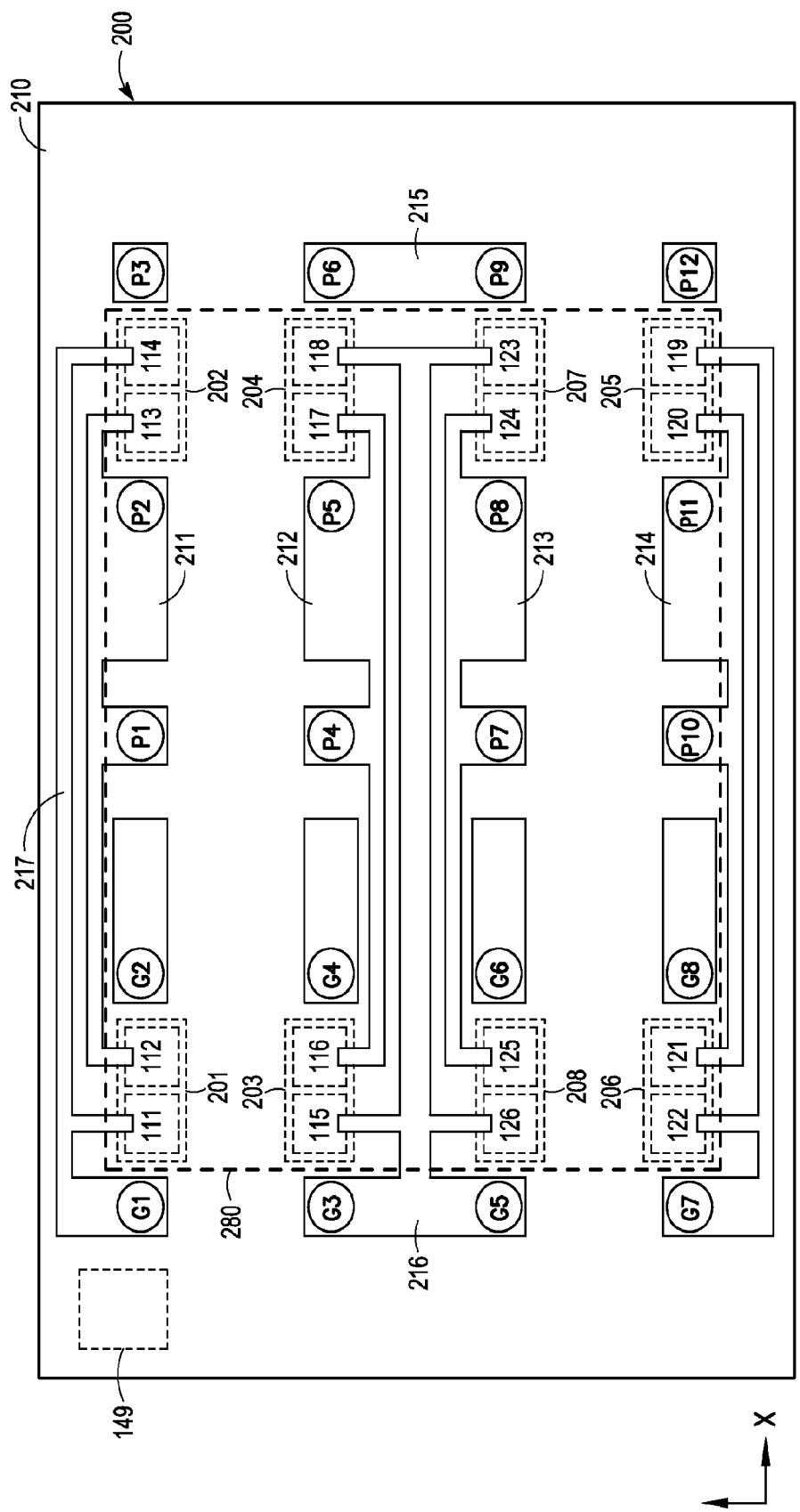
FIG. 2B shows the same top view of a structure of the device of FIG. 2A but without some conductive lines and showing an area in the die where power amplifier cells are located, according to some embodiments described herein.

As shown in FIG. 2A and FIG. 2B, power amplifier cells 111 through 126 may be formed in portions 201 through 208 in die 200 and below surface 210. For clarity, FIG. 2B shows the same top view of the structure of the device 100 of FIG. 2A but without conductive lines 131 through 139. FIG. 2B also shows a die area (e.g., a square or a rectangle) 280 in die 200 where power amplifier cells 111 through 126 are located. As shown in FIG. 2B, power amplifier cells 111 through 126 may be distributed (e.g., in an equal number of amplifier cells) among the eight locations associated with portions 201 through 208 within die area 280 of die 200. Each of the eight locations may include two of power amplifier cells 111 through 126.

As can be seen from the top view of die 200 in FIG. 2A, a group of power amplifier cells (e.g., 115 through 118 and 123 through 126) may be located inside transformer circuit 140 (e.g., located in the loop formed by conductive line 139). Another group of power amplifier cells (e.g., 111 through 114 and 119 through 122) may be located outside transformer circuit 140 (e.g., located outside the loop formed by conductive line 139).

Conductive contacts G1 through G8 and P1 through P12 may be coupled to portions 201 through 208 (locations of power amplifier cells 111 through 126) through a number of routings. The routings may include a combination of connections (e.g., 211 through 218) overlying surface 210 and conductive paths (FIG. 3A and FIG. 3B) below surface 210 coupled to the connections. The conductive paths may extend between surface 210 and portions 201 through 208 in die 200.

For example, power amplifier cells 111 and 112 (at portion 201) and 113 and 114 (at portion 202) may be coupled to conductive contact G1 through connection 217 and to conductive contacts P1 and P2 through connection 211. Power amplifier cells 115 and 116 (at portion 203) and 117 and 118 (at portion 204) may be coupled to contracts G3 and G5 through connection 216 and to conductive contacts P4 and P5 through connection 212. Power amplifier cells 119 and 120 (at portion 205) and 121 and 122 (at portion 206) may be coupled to contract G7 through a connection 217 and to conductive contacts P10 and P11 through connection 214. Power amplifier cells 123 and 124 (at portion 207) and 125 and 126 (at portion 208) may be coupled to contracts G3 and G5 through a connection 216 and to conductive contacts P7 and P8 through connection 213.

The structure of power amplifier 101, as shown in FIG. 2A and FIG. 2B may allow die 200 to be used efficiently, the size of power amplifier 101 to be compact, and heat distribution to be improved. For example, some conventional transformers may occupy a relatively large area of a device because transformer components (e.g., inductors) usually require dedicated area away from other passive and active components of the device. Conventional transformers in some types of IC packages (e.g., flip chip package) may require even larger area because locations of conductive contacts (e.g., solder bumps) in such types of IC packages may limit turns routing of transformer components. In power amplifier 101 of FIG. 2A, device area (e.g., area on surface 210) may be used more efficiently because the conductor turns (e.g., conductive lines 131 through 139) of the transformers of transformer circuit 140 may be routed in surface areas between conductive contacts G1 through G8 and P1 through P12. Further, by correctly arranging supply power connections (211 through 218 in FIG. 2A and FIG. 2B) and conductor turns (e.g., conductive lines 131 through 139) of the transformers of transformer circuit 140, the topology described herein may also be fit into flip-chip packages and may still allow regular solder bump pattern (e.g., pattern including conductive contacts G1 through G8 and P1 through P12) of the flip-chip packages to maintain compliance with package design rules.

The size of power amplifier 101 may be relatively smaller than that of some conventional power amplifiers. For example, since power cells 111 through 126 may be located inside and outside (FIG. 2A) transformer circuit 140, power cells 111 through 126 may occur a relatively compact area, which may be smaller than that of some conventional power amplifiers. In some structures, die area 280 (FIG. 2B) may be approximately 0.8 square millimeters.

Since power cells 111 through 126 of power amplifier 101 may be evenly distributed in various portions of die 200 within die area 280, heat from power amplifier 101 may uniformly spread, such as by dissipating through a body (e.g., well) of die 200. This may reduce hotspots in die 200 (or in an IC package that contains die 200).

Further, the structure of power amplifier 101 may allow it to be implemented using digital devices, such as a combination of NMOS and PMOS transistors. For example, in some multi-section transformers, each of the multi-section transformers may need to have similar or identical inductance and coupling factor to obtain maximum performance. Some conventional power amplifiers may have amplifier cells with transistors gate rotate 90 degrees among each other to maintain symmetry. Thus, CMOS process may not be applicable to fabricate transistors in some conventional power amplifiers because the mentioned 90 degrees orientation would violate CMOS process rules. In power amplifier 101, the arrangement of power amplifier cells 111 through 126 as shown in FIG. 2A may satisfy the inductance and coupling factor for multi-section transformers. The arrangement of power amplifier cells 111 through 126 may also avoid the 90 degree gate rotation that some conventional power amplifiers may require. For example, as described above, the gates of transistors in power amplifier cells 111 through 126 may extend in the same direction (e.g., the X-direction or the Y-direction in FIG. 2A). This may allow power amplifier 101 to comply with CMOS process design rules. Thus, transistors of power amplifier 101 may be structured using CMOS. Moreover, by selecting location of transformer feed-in points, the transformers (e.g., at sections 140a through 140d) of power amplifier may be located close to each other, thereby the size of power amplifier 101 may be further reduced.

FIG. 3A shows a cross section along the X-direction of device 100 of FIG. 2A including connections 211 and 217 overlying surface 210 of die 200 and conductive paths 311a, 311b, 318a, and 318b formed in portion 341 of die 200. Portion 341 may include one or more layers having routings (metallization routings) to carry signals internally among components of die 200 or signals between components of die 200 and other external devices.

As shown in FIG. 3A, conductive paths 311a, 311b, 318a, and 318b may extend between surface 210 and portions 201 through 208 in die 200. Each of conductive paths 311a, 311b, 318a, and 318b may be formed in one or more via (e.g., holes containing conductive material) in portion 341. FIG. 3A shows an example where each of conductive paths 311a, 311b, 318a, and 318b may completely extend vertically along the Z-direction, which is substantially perpendicular to the X-direction. Each of conductive paths 311a, 311b, 318a, and 318b, however, may include one or more segment that may extend in a different direction different from the Z-direction (e.g., extend horizontally along the X-direction or the Y-direction). Connections 151 through 158 (FIG. 1) may be formed in portion 341. As described above, some or all of connections 151 through 158 may be omitted.

As shown in FIG. 3A, conductive contacts P1 and P2 may be coupled to supply node 198 associated with power amplifier cell 112 through connection 211 and conductive path 311a. Conductive contacts P1 and P2 may also be coupled to supply node 198 associated with power amplifier cell 113 through connection 211 and conductive path 311b. Power amplifier cells 111 and 112 may share the same connection at supply node 198 at portion 201. Power amplifier cells 113 and 114 may share the same connection at supply node 198 at portion 201.

Conductive contact G1 may be coupled to supply node 199 associated with power amplifier cell 112 through connection 217 and conductive path 318a. Conductive contact G1 may also be coupled to supply node 199 associated with power amplifier cell 113 through connection 217 and conductive path 318b. Power amplifier cells 111 and 112 may share the same connection at supply node 199 at portion 201. Power amplifier cells 113 and 114 may share the same connection at supply node 199 at portion 202.

Certain types of IC packages (e.g., flip chip) may have power contacts grouped in one side of a surface of the device and ground contacts grouped in another side of the surface of the device. This may limit power and ground signals to be delivered to some other areas of the device. In power amplifier 101, using conductive lines 211 through 218 (FIG. 2A) and conductive paths 311a, 311b, 318a, and 381b (FIG. 3A to directly couple conductive contacts G1 through G8 and P1 through P12 to supply nodes (e.g., 198 and 199 in FIG. 3A of the power amplifier cells may provide robust un-interrupted and dedicated connections from conductive contacts G1 through G8 and P1 through P12 to the power amplifier cells to the power amplifier cells. This may provide a robust and un-interrupted supply network (e.g., power and ground signals) from conductive contacts G1 through G8 and P1 through P12 to the power amplifier cells.

FIG. 3B shows another cross section along the X-direction of device 100 of FIG. 2A including conductive lines 131, 133, and 137 overlying surface 210 of die 200 and conductive paths 331a, 331b, 333, and 337 formed in portion 341 of die 200. As shown in FIG. 3B, conductive paths 331a, 331b, 333, and 337 may extend between surface 210 and portions 201 through 208 in die 200. Each of conductive paths 331a, 331b, 333, and 337 may be formed in one or more via (e.g., holes containing conductive material) in portion 341. FIG. 3A shows an example where each of conductive paths 311a, 331a, 331b, 333, and 337 may completely extend vertically along the Z-direction. Each of conductive paths 331a, 331b, 333, and 337, however, may include one or more segment that may extend in a different direction different from the Z-direction (e.g., extend horizontally along the X-direction or the Y-direction).

As shown in FIG. 3B, conductive line 131 may be coupled to output nodes 112a and 113a of power amplifier cells 112 and 113, respectively, through conductive paths 331a and 331b. Conductive line 133 may be coupled to output node 114a of power amplifier cell 114 through conductive path 333. Conductive line 137 may be coupled to output node 111a of power amplifier cell 111 through conductive path 337.

As described above with reference to FIG. 1, each of power amplifier cells 111 through 126 may include a single transistor or multiple transistors. In FIG. 3A, for example, each of power amplifier cells 111 through 124 may include one or more transistors that can be formed in portions 201 and 202. The transistors may be formed using CMOS processes. Thus, the gates of the transistors may extend in the same direction (e.g., the X-direction or the Y-direction).

Figure 3C:
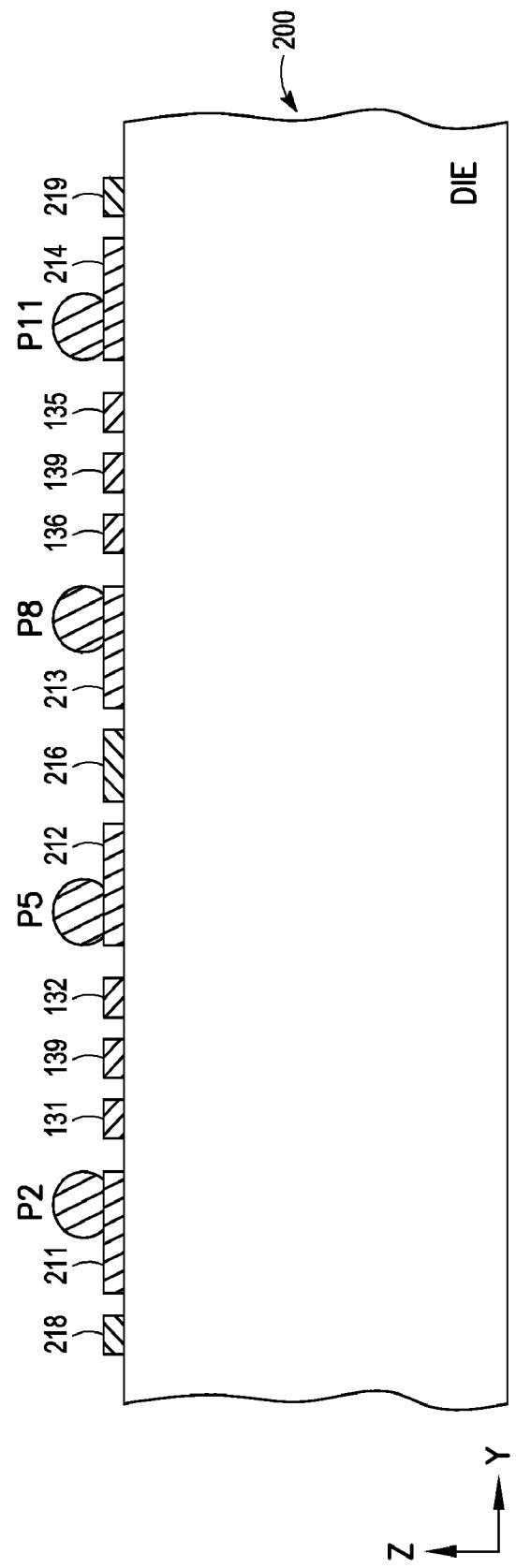
FIG. 3C shows a cross section along line 3C in the Y-direction of the device of FIG. 2A.

FIG. 3C shows a cross section along the Y-direction of device 100 of FIG. 2A. As shown in FIG. 3C, three conductive segments of three respective conductive lines 131, 132, and 139 may be located between conductive contact P2 and P5. Three conductive segments of three respective conductive lines 135, 136, and 139 may be located between conductive contacts P8 and P11.

Thus, as described above with reference to FIG. 1 through FIG. 3C, power amplifier 101 may include power amplifier cells 111 through 126 formed in die 200 (FIG. 2A), at least part of conductive contacts G1 through G8 and P1 through P12 overlying surface 210 of die 200, and conductive lines 131 through 139 overlying surface 210. Power amplifier 101 may include connections (e.g., 211 through 219 in FIG. 2A) overlying surface 210 and coupled to some of conductive contacts G1 through G8 and P1 through P12. Power amplifier 101 may include conductive paths (e.g., 311a, 311b, 318a, 318b, 331a, 331b, 333, and 337 in FIG. 3A and FIG. 3B) extending between surface 210 and power amplifier cells 111 through 126. Power amplifier cells 111 through 126 may include supply nodes (e.g., 198 and 199 in FIG. 3A and FIG. 3B) coupled to some of the conductive contacts G1 through G8 and P1 through P12 through the connections and the conductive paths.

Figure 4:
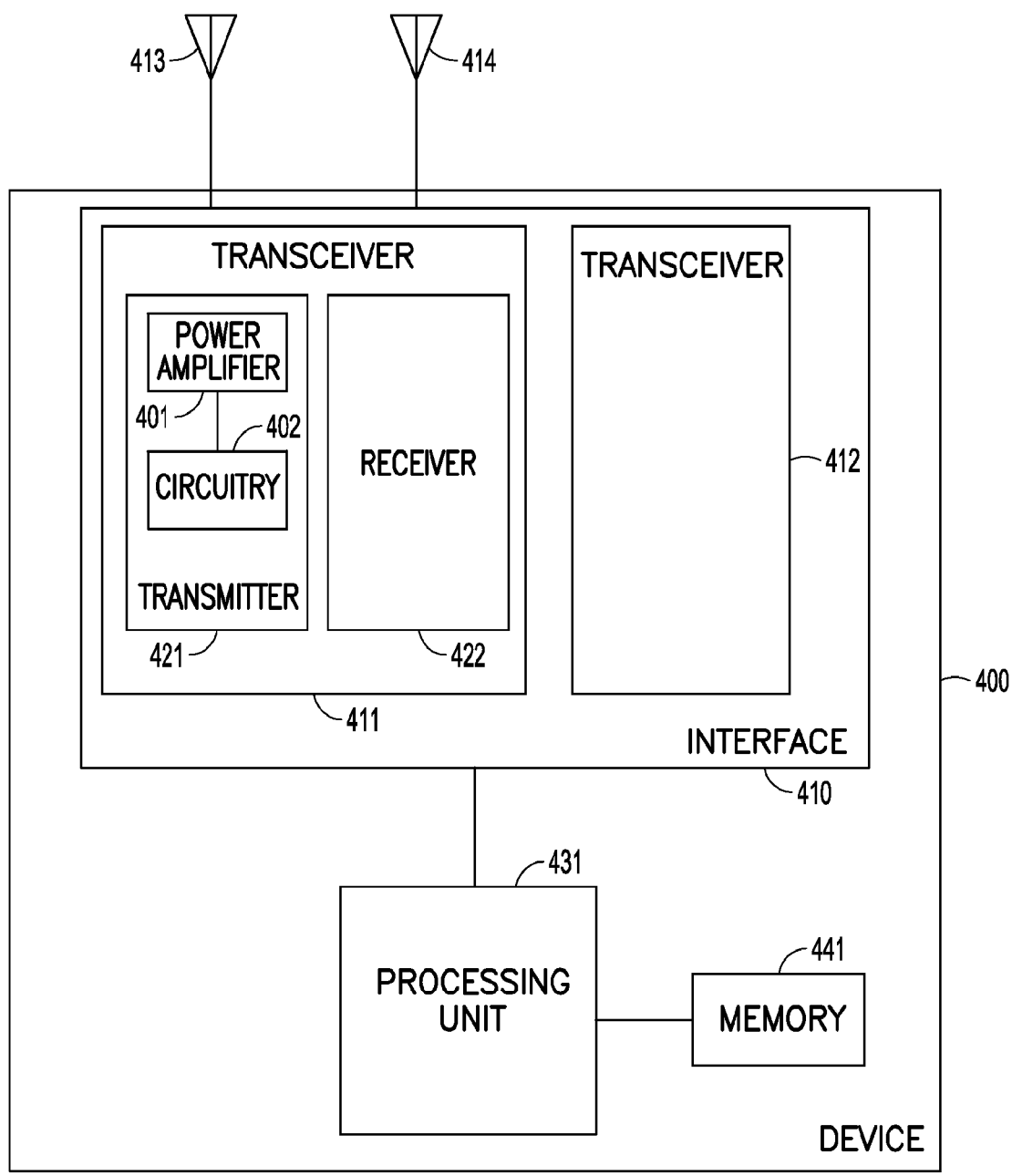
FIG. 4 shows a block diagram of a device including an interface, according to some embodiments described herein.

FIG. 4 shows a block diagram of user equipment 400 including an interface 410 according to some embodiments described herein. User equipment may include device 100 described above with reference to FIG. 1 through FIG. 3C. As shown in FIG. 4, user equipment may also include antennas 413 and 414, a processing unit 431, and a memory 441. For simplicity, FIG. 4 omits other elements of device 100 to not obscure the embodiments described herein. For example, device 100 may include one or more of a keyboard, a display (e.g., an LCD screen including a touch screen), a non-volatile memory port (e.g., a Universal Serial Bus (USB) port), a graphics processor, an application processor, speakers, and other elements.

User equipment 400 may include portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

Processing unit 431 and interface 410 of user equipment 400 may be configured to communicate with a single type of communication network or multiple types of communication networks. For example, processing unit 431 and interface 410 may be configured to communicate with one or more of WiFi, WiMax, LTE, and other communication networks.

Processing unit 431 may include a single processor or multiple processors. The processor or processors may include one or more general purpose processors, one or more application-specific integrated circuits (ASICs), or other types of processors. Processing unit 431 may configure messages for transmission by interface 410 to other devices. Processing unit 431 may be configured to communicate with the interface 410 to wirelessly exchange messages with other devices.

Memory 441 may include volatile memory, non-volatile memory, or a combination of both. Memory 441 may contain instructions (e.g., firmware programs, software programs, or a combination of both), which when executed by processing unit 431 result in user equipment performing operations. Such operations may include wirelessly transmitting, receiving, or both, signals to or from user equipment through antennas 413 and 414.

As shown in FIG. 4, interface 410 may include transceivers 411 and 412, each of which may be configured to communicate with a different network. For example, transceiver 411 may be configured to communicate with an LTE network, and transceiver 412 may be configured to communicate with a WiMax network. FIG. 4 shows an example where user equipment includes two transceivers (e.g., 421 and 422) and two antennas (e.g., 413 and 414). The number of transceivers and antennas may vary.

Transceiver 411 may include a transmitter 421 and a receiver 422 to wirelessly exchange (e.g., send and receive) messages with other devices (not shown in FIG. 4) through at least one of antennas 413 and 414 in at least one of the networks described above. Transceiver 412 may also include a transmitter and a receiver (not shown in FIG. 4) to wirelessly exchange messages with other devices through at least one of antennas 413 and 414.

Device 100 may include or be included in user equipment (e.g., a cellular phone, a tablet computer, or other equipments). Thus, the transmitter 421 may be part of user equipment configured to operate in an LTE network or in another single network or multiple networks among the networks described above (e.g., WiFi, WiMax, and other networks).

At least one of transceivers 411 and 412 may include a power amplifier. For example, transmitter 412 of transceiver 411 may include power amplifier 401. Power amplifier 401 may include power amplifier 101 described above with reference to FIG. 1 through FIG. 3C.

As shown in FIG. 4, transmitter 412 may include circuitry 402 to generate signals for transmission. Power amplifier 401 may receive signals (e.g., input signals) generate by circuitry 402 and provide signals (e.g., output signals) to at least one of antennas 413 and 414 for transmission. The signals (e.g., input signals) received by power amplifier 401 may include signals similar to or identical to signals "+" and "−" received by power amplifier 101 described above with reference to FIG. 1 through FIG. 3C. Thus, the signals (e.g., output signals) provided by power amplifier 401 to antennas 413 and 414 may include signals similar to or identical to signals Vout+ and Vout− (or alternatively, signals based on signals Vout+ and Vout−) provided by power amplifier 101.

Transmitter 421 of transceiver 411 in FIG. 4 may include an OFDM transmitter, such that at least one of the signals generated by circuitry 402 may include an orthogonal frequency-division multiplexing (OFDM) signal.

User equipment 400 may be configured to operate in a multiple-input multiple-output (MIMO) configuration. Thus, power amplifier 401 may be coupled to multiple antennas of user equipment 400 (e.g., at least antennas 413 and 414) for MIMO transmissions. The signals generated by circuitry 402 may include precoded OFDM signals for MIMO transmissions.

Further, transmitter 421 may also include a MIMO transmitter arranged to transmit OFDM signals over an uplink channel using a plurality of antenna ports (e.g., antenna ports associated with antennas 413 and 414). The MIMO transmitter may include at least one RF power amplifier (e.g., power amplifier 401) associated with each of the antenna ports.

In FIG. 4, antennas 413 and 414 may include one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In such embodiments, each aperture may be considered a separate antenna. In some MINO embodiments, the antennas may be effectively separated to take advantage of spatial diversity and the different channel characteristics that may result between each of antennas and the antennas of a transmitting station. In some MIMO embodiments, the antennas may be separated by up to $1/10$ of a wavelength or more.

Although user equipment is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments described herein may be implemented in one or a combination of hardware, firmware and software. Embodiments described herein may also be implemented as instructions stored on a computer-readable storage medium, which may be read and executed by at least one processor to perform the operations described herein. A computer-readable storage medium may include any non-transitory mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors of user equipment may be configured with the instructions to perform the operations described herein.

Figure 5:
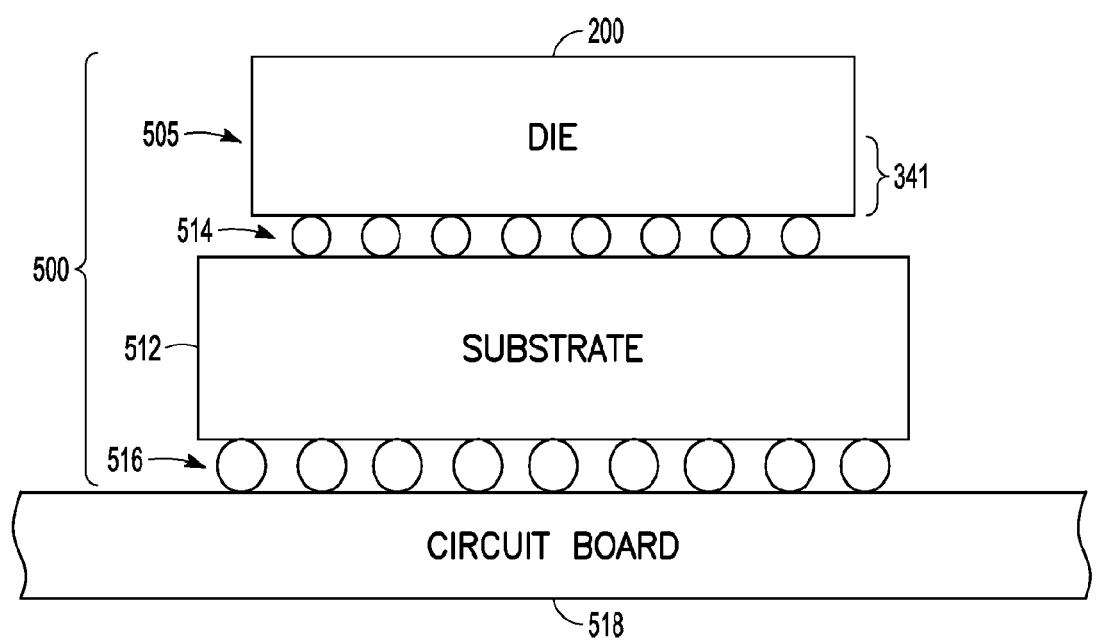
FIG. 5 shows an integrated circuit (IC) package including a die of the device of FIG. 1 through FIG. 4, according to some embodiments described herein.

FIG. 5 shows IC package 500 including a device 505, according to some embodiments described herein. IC package 500 may correspond to a flip chip package. Device 505 may include device 100 of FIG. 1 or user equipment of FIG. 4. As shown in FIG. 5, device 505 may include die 200 including portion 341 (also shown in FIG. 3B). Die 200 including a power amplifier, such as power amplifier 101, is described above with reference to FIG. 1 through FIG. 3C. In FIG. 5, IC package 500 may include a package substrate (e.g., organic substrate) 512.

Die 200 may be coupled to package substrate 512 through connections 514 without using bonding wires. Connections 514 may include controlled collapse chip connections. Package substrate 512 may be coupled to a circuit board (e.g., printed circuit board) 518 through connections (e.g., solder balls, or pins) 516. Package substrate 512 may include conductive elements (e.g., conductive vias, not shown) coupled to connections 514 and 516 to carry signals (data, clock, power, and other signals) between die and other components (not shown) on circuit board 518.

The illustrations of apparatuses (e.g., devices 100 and 400 and IC package 500) described herein are intended to provide a general understanding of the structure of various embodiments and are not intended to provide a complete description of all the elements and features of apparatuses that might make use of the structures described herein.

The embodiments described above with reference to FIG. 1A through FIG. 4 include a power amplifier having power amplifier cells located in a die, conductive contacts overlying a surface of the die and coupled to the amplifier cells, and conductive lines overlying a surface of the die between the conductive contacts and coupled to the power amplifier cells. Other embodiments including additional apparatuses and methods are described.

The above description and the drawings illustrate some embodiments to enable those skilled in the art to practice the embodiments of the inventions. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A power amplifier comprising:
   power amplifier cells located in a die;
   conductive contacts overlying a surface of the die and coupled to the amplifier cells; and
   conductive lines overlying a surface of the die between the conductive contacts and coupled to the power amplifier cells, wherein the conductive lines form part of a transformer circuit of the power amplifier, the transformer circuit includes a single turn transmission line type transformer circuit, and the conductive lines form at least part of a primary and a secondary of the transformer circuit, the conductive contacts include solder bumps, the conductive lines are routed in areas between the conductive contacts, and, wherein power amplifier cells include a first group of power amplifier cells located inside the transformer circuit and a second group of power amplifier cells located outside the transformer circuit.

2. The power amplifier of claim 1, wherein the power amplifier cells are distributed among a number of locations of the die, such that the locations include an equal portion of the power amplifier cells.

3. A power amplifier comprising:
   power amplifier cells located in a die;
   conductive contacts overlying a surface of the die and coupled to the amplifier cells; and
   conductive lines overlying a surface of the die between the conductive contacts and coupled to the power amplifier cells, wherein the conductive lines form part of a transformer circuit of the power amplifier, and, wherein each of the power amplifier cells includes supply nodes, and at least a portion of the conductive contacts is directly coupled to the supply to provide un-interrupted power and ground signals from the portion of the conductive contacts to the supply nodes of each of the power amplifier cells.

4. The power amplifier of claim 3, wherein each conductive contact in the portion of the conductive contacts is configured to receive one of the power and ground signals, and three conductive lines among the conductive include three respective conductive portions located between two conductive contacts among the conductive contacts.

5. A power amplifier comprising:
   power amplifier cells located in a die;
   a first group of conductive contacts overlying a surface of the die to receive power signals;
   a second group of conductive contacts overlying the surface of the die to receive ground signals;
   conductive lines overlying the surface; and
   conductive paths extending between the surface and the power amplifier cells, wherein a portion of the first group of conductive contacts is coupled to at least one of the power amplifier cells through a first portion of the conductive paths, a portion of the second group of conductive contacts is coupled to at least one of the power amplifier cells through a second portion of the conductive paths, and a portion of the conductive lines is coupled to the power amplifier cells through a third portion of the conductive paths, wherein the conductive lines and the third portion of the conductive paths conductive paths form part of a transformer circuit to combine signals provided by the power amplifier cells.

6. The power amplifier of claim 5, wherein power amplifier cells include complementary metal-oxide-semiconductor (CMOS) transistors operating at a supply voltage of approximately one volt.

7. The power amplifier of claim 5, wherein each of the power amplifier cells includes an output node coupled to one of the conductive lines through one of the conductive paths.

8. The power amplifier of claim 7, wherein each of the power amplifier cells includes an input node to receive a component of a differential signal.

9. The power amplifier of claim 5, wherein a first power amplifier cell of the power amplifier cells includes a first output node and a second power amplifier cell of the power amplifier cells include a second output node, and the first and second output nodes area coupled to a same conductive line among the conductive lines.

10. The power amplifier of claim 5, wherein the conductive lines form part of a transmission line transformer.

11. The power amplifier of claim 5, wherein the first group of conductive contacts is located on a first side of the surface, the second group of conductive contacts is located on a second side of the surface.

12. The power amplifier of claim 5, wherein one of the conductive lines forms at least part of a loop, wherein a first conductive contact of one of the first and second groups of conductive contacts is located inside the loop, and a second conductive contact of one of the first and second groups of conductive contacts is located outside the loop.

13. The power amplifier of claim 12, wherein the first conductive contact is coupled to a first power amplifier cell of the power amplifier cells, the second conductive contact is coupled to a second power amplifier cell of the power amplifier cells, the first power amplifier cell is located inside the loop, and the second power amplifier cell is located outside the loop.

14. The power amplifier of claim 12, wherein a first conductive line of the conductive lines is located inside the loop, and a second conductive line of the conductive lines is located outside the loop.

15. The power amplifier of claim 14, wherein the first conductive line is coupled to one of an input node and output node of a first power amplifier cell of the power amplifier cells, the second conductive contact is coupled to one of an input node and output node of a second power amplifier cell of the power amplifier cells, the first power amplifier cell is located inside the loop, and the second power amplifier cell is located outside the loop.

16. The power amplifier of claim 5, wherein the power amplifier cells are located within a die area of approximately 0.8 square millimeters.

17. The power amplifier of claim 16, wherein the power amplifier has an output power in a range of approximately 26 dBm to approximately 32 dBm.

18. An orthogonal frequency-division multiplexing (OFDM) transmitter comprising:
circuitry to generate at least one OFDM signal for transmission; and
a power amplifier to amplify the at least one OFDM signal, the power amplifier including:
power amplifier cells located in a die;
conductive contacts overlying a surface of the die and coupled to the amplifier cells; and
conductive lines overlying a surface of the die between the conductive contacts and coupled to the power amplifier cells, wherein the power amplifier cells include transistors operating at a supply voltage of approximately one volt, and the power amplifier has an output power in a range of approximately 26 dBm to approximately 32 dBm.

19. The OFDM transmitter of claim 18, wherein the conductive lines form part of a number of transformers coupled to output nodes of the sixteen power amplifier cells, and the conductive contacts are coupled to supply nodes of the power amplifier cells to provide the supply voltage to power amplifier cells.

20. The OFDM transmitter of claim 18, wherein the power amplifier is coupled to multiple antennas for multiple-input multiple-output (MIMO) transmissions, and the at least one OFDM signal includes OFDM signals precoded for MIMO transmissions.

21. An OFDM transmitter of claim 18, wherein the OFDM transmitter is part of user equipment configured to operate in a long term evolution (LTE) network.

22. User equipment comprising:
radio frequency (RF) power amplifier including power amplifier cells located in a die, a transformer based combiner including conductive lines overlying a surface of the die and coupled to the power amplifier cells; controlled collapse chip connections overlying a surface of die, a portion of the controlled collapse chip connections coupled to the power amplifier cells, and at least a portion of the conductive lines located between the portion of the controlled collapse chip connections; and
at least one antenna coupled to the RF power amplifier.

23. The user equipment of claim 22, wherein the conductive lines include three conductive lines located between two of the controlled collapse chip connections.

24. The user equipment of claim 23, wherein two of the conductive lines form at least part of a primary of a transformer circuit of the transformer based combiner, and one of the three conductive lines form at least part of a secondary of the transformer circuit.

25. The user equipment of claim 24, further comprising a package substrate coupled to the die through the controlled collapse chip connections.

26. The user equipment of claim 22, wherein the RF power amplifier is part of a multiple-input multiple-output (MIMO) transmitter arranged to transmit orthogonal frequency-division multiplexing (OFDM) signals over an uplink channel using a plurality of antenna ports, and the MIMO transmitter includes at least one RF power amplifier associated with each of the antenna ports.

* * * * *